United States Patent
Lee et al.

(10) Patent No.: US 7,811,913 B2
(45) Date of Patent: Oct. 12, 2010

(54) METHOD OF FABRICATING A LOW, DARK-CURRENT GERMANIUM-ON-SILICON PIN PHOTO DETECTOR

(75) Inventors: Jong-Jan Lee, Camas, WA (US);
Douglas J. Tweet, Camas, WA (US);
Jer-Shen Maa, Vancouver, WA (US);
Sheng Teng Hsu, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 773 days.

(21) Appl. No.: 11/312,967

(22) Filed: Dec. 19, 2005

(65) Prior Publication Data
US 2007/0141744 A1    Jun. 21, 2007

(51) Int. Cl.
*H01L 21/265* (2006.01)
(52) U.S. Cl. .................. 438/522; 438/514; 438/660; 438/761; 438/788; 438/933
(58) Field of Classification Search .............. 438/514, 438/522, 660, 752, 761, 788, 792, 933, FOR. 134, 438/FOR. 291
See application file for complete search history.

(56) References Cited

U.S. PATENT DOCUMENTS

| | | | | |
|---|---|---|---|---|
| 5,371,399 A | * | 12/1994 | Burroughes et al. | 257/451 |
| 5,471,948 A | * | 12/1995 | Burroughes et al. | 438/93 |
| 6,897,498 B2 | * | 5/2005 | Gothoskar et al. | 257/226 |
| 2003/0047752 A1 | * | 3/2003 | Campbell et al. | 257/186 |
| 2004/0188794 A1 | * | 9/2004 | Gothoskar et al. | 257/459 |
| 2006/0237746 A1 | * | 10/2006 | Orlowski et al. | 257/192 |
| 2007/0099329 A1 | * | 5/2007 | Maa et al. | 438/57 |
| 2007/0138570 A1 | * | 6/2007 | Chong et al. | 257/371 |

OTHER PUBLICATIONS

Masini et al., *High-performance p-i-n photodetectors for the near infrared: from model to demonstration*, IEEE Trans. Electron Devices, vol. 48, pp. 1092-1096 (2001).
U.S. Appl. No. 11/149,993, filed Jun. 10, 2005, Maa et al.

* cited by examiner

*Primary Examiner*—Matthew Smith
*Assistant Examiner*—Joannie A Garcia
(74) *Attorney, Agent, or Firm*—David C. Ripma

(57) ABSTRACT

A method of fabricating a low, dark-current germanium-on-silicon PIN photo detector includes preparing a P-type silicon wafer; implanting the P-type silicon wafer with boron ions; activating the boron ions to form a P+ region on the silicon wafer; forming a boron-doped germanium layer on the P+ silicon surface; depositing an intrinsic germanium layer on the boron-doped germanium layer; cyclic annealing, including a relatively high temperature first anneal step and a relatively low temperature second anneal step; repeating the first and second anneal steps for about twenty cycles, thereby forcing crystal defects to the P+ germanium layer; implanting ions in the surface of germanium layer to form an N+ germanium surface layer and a PIN diode; activating the N+ germanium surface layer by thermal anneal; and completing device according to known techniques to form a low dark-current germanium-on-silicon PIN photodetector.

13 Claims, 3 Drawing Sheets

METHOD OF FABRICATING A LOW, DARK-CURRENT GERMANIUM-ON-SILICON PIN PHOTO DETECTOR

FIELD OF THE INVENTION

This invention relates to infrared photodetectors, and specifically to a germanium-based infrared photodetector.

BACKGROUND OF THE INVENTION

As described in U.S. patent application Ser. No. 11/149,883, of Maa et al., filed Jun. 10, 2005, for *Method of Fabricating a Low-defect Strained Epitaxial Germanium Film on Silicon*, a cyclic anneal of a germanium film on silicon effectively reduces the defect density and moves the defects to the bottom of germanium film near the germanium/silicon interface.

Masini et al., *High-performance p-i-n photodetectors for the near infrared: from model to demonstration*, IEEE Trans. Electron Devices, vol. 48, pp 1092-1096 (2001), describes calculation of dark current density, based on the band diagram and the defect on the germanium/silicon interface.

SUMMARY OF THE INVENTION

A method of fabricating a low, dark-current germanium-on-silicon PIN photo detector includes preparing a P-type silicon wafer; implanting the P-type silicon wafer with boron ions; activating the boron ions to form a P+ silicon surface on the silicon wafer; forming a boron-doped germanium layer on the P+ region, which includes forming a germanium layer by a method taken from the group of methods consisting of in-situ deposition of a doped p-type germanium layer, wherein the dopant is boron at a concentration is between about $5 \cdot 10^{17}$ cm$^{-3}$ to $2 \cdot 10^{20}$ cm$^{-3}$, and wherein the thickness of the layer is between about 50 nm to 500 nm and growth of an intrinsic germanium layer, which is implanted with boron ions at an energy of between about 5 keV to 100 keV, and an ion dose of between about $1 \cdot 10^{14}$ cm$^{-2}$ to $1 \cdot 10^{16}$ cm$^{-2}$; depositing an intrinsic germanium layer on the boron-doped germanium layer; cyclic annealing, including heating in a first anneal step at a temperature of about 880° C. for about five minutes, followed by heating in a second anneal step at a temperature of about 760° C. for about five minutes, and repeating the first and second anneal steps for about twenty cycles, thereby forcing crystal defects to the P+ germanium layer; implanting ions in the surface of germanium layer to form an N+ germanium surface layer and a PIN diode; activating the N+ germanium layer by thermal anneal; and completing device according to known techniques to form a low dark-current germanium-on-silicon PIN photodetector.

It is an object of the method of the invention to provide a low dark-current germanium-on-silicon PIN photo detector.

Another object of the method of the invention is to provide a germanium-on-silicon device wherein crystal defects are located in a P+ germanium region and wherein an electric field does not exist in the P+ germanium region.

This summary and objectives of the invention are provided to enable quick comprehension of the nature of the invention. A more thorough understanding of the invention may be obtained by reference to the following detailed description of the preferred embodiment of the invention in connection with the drawings.

DETAILED DESCRIPTION OF THE PREFERRED EMBODIMENTS

The fabrication of germanium PIN photodiode is usually completed by intrinsic germanium deposition on either a p-type silicon substrate or on an n-type silicon substrate. Ion implantation and dopant activation are usually carried out to form a p+ surface layer on a p-type silicon substrate prior to germanium deposition.

Figure 1:
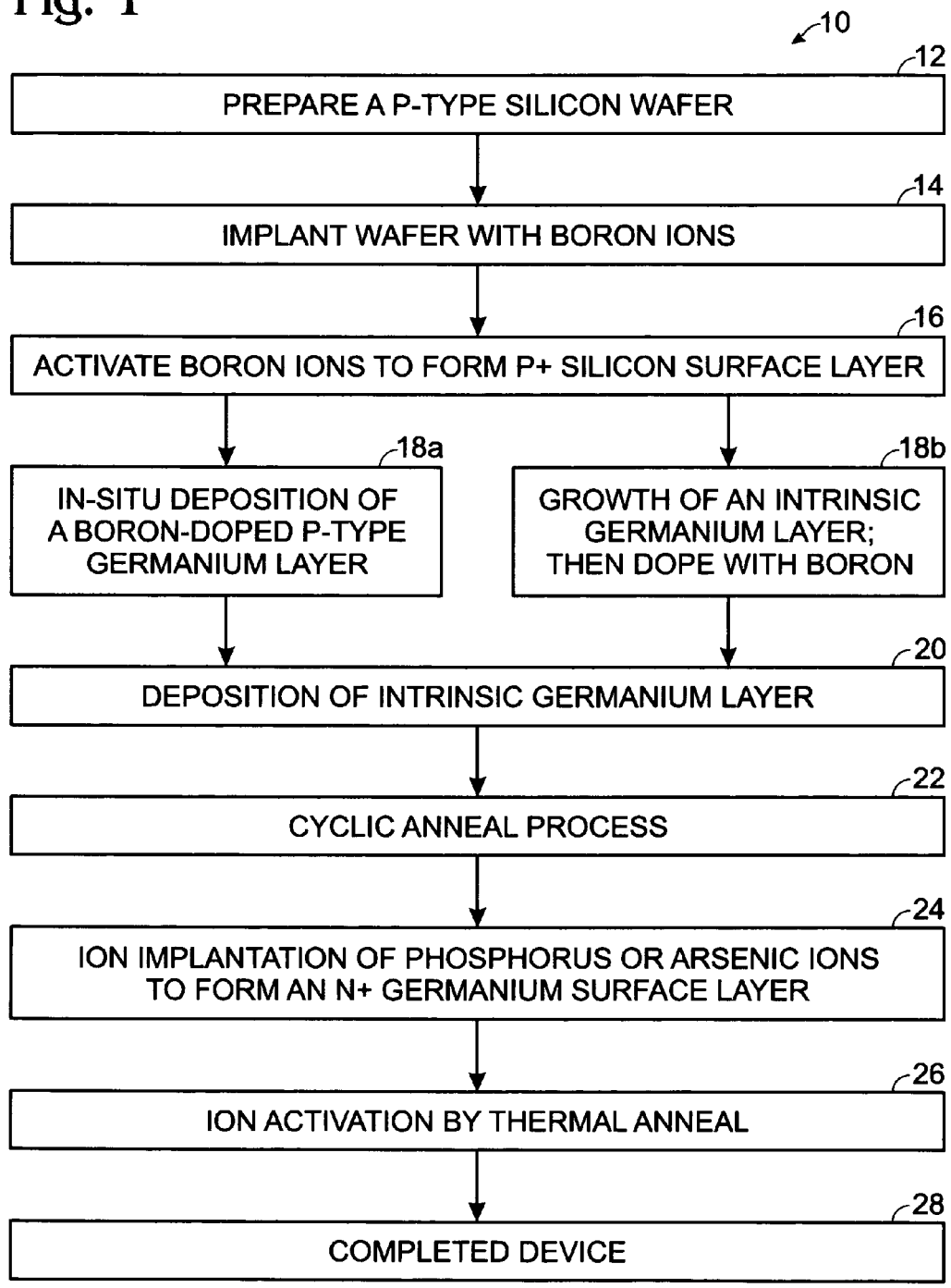
FIG. 1 is a block diagram of the method of the invention.

The fabrication of a photodetector according to the method of the invention is described using an example of n+ germanium/intrinsic germanium/p+ germanium/p+ silicon substrate. Referring now to FIG. 1, the method of the invention is depicted generally at 10. The first step in the method of the invention is preparation of a P-type silicon wafer, 12. The wafer is implanted with boron ions, 14, which are then activated 16, to form a P+ silicon surface region on the silicon wafer surface. An important aspect of the method of the invention is the formation of a boron-doped germanium layer on the silicon surface of the wafer, which may be accomplished by either (1) in-situ deposition of a boron-doped p-type germanium layer, 18a, wherein the boron concentration is between about $5 \cdot 10^{17}$ cm$^{-3}$ to $2 \cdot 10^{20}$ cm$^{-3}$, and wherein the thickness of the layer is between about 50 nm to 500 nm; or (2) growth of an intrinsic germanium layer on the P+ region of the silicon wafer, 18b, which is then implanted with boron ions at an energy of between about 5 keV to 100 keV, and an ion dose of between about $1 \cdot 10^{14}$ cm$^{-2}$ to $1 \cdot 10^{16}$ cm$^{-2}$. Either step 18a or 18b may be used in the method of the invention, however, this step of the method of the invention is considered critical to the method of the invention and the reported results.

The next step of the method of the invention is deposition of intrinsic germanium to a thickness of between about 300 nm to 4000 nm, 20. The structure fabricated to this point in the method of the invention is then subject to a cyclic anneal process, 22, which includes heating in a first anneal step at a temperature of about 880° C. for about five minutes, followed by heating in a second anneal step at a temperature of about 760° C. for about five minutes. The first and second anneal steps are repeated, alternately, for about 20 cycles, which causes the crystal defect to accumulate in an area where they cause the least amount of degradation to the electrical properties of the finished device. The cyclic anneal drives the crystal defect to the P+ germanium layer.

Next, ion implantation 24, of either phosphorus ions or arsenic ions, in the surface of germanium layer to form a N+ surface layer, at a dose of between about $5 \cdot 10^{14}$ cm$^{-2}$ to $1 \cdot 10^{16}$ cm$^{-2}$, and at an energy of between about 5 keV to 100 keV. The N+ germanium layer is activated 26 by thermal anneal, at a temperature of between about 500° C. to 800° C., and an annealing time of between about 1 second to 10 hours. The PIN device is then completed, 28 according to known techniques of lithography and etching to form a low dark-current germanium-on-silicon PIN photodetector.

Figure 2:
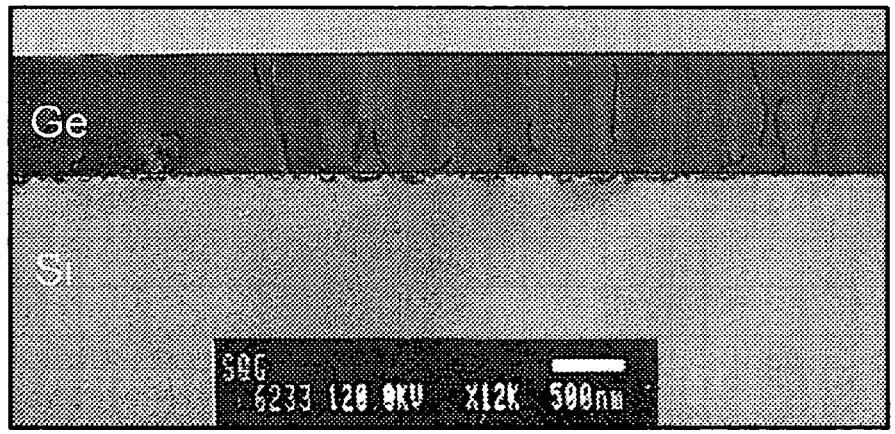
FIG. 2 depicts a CVD deposited germanium thin film on a silicon wafer.
Figure 3:
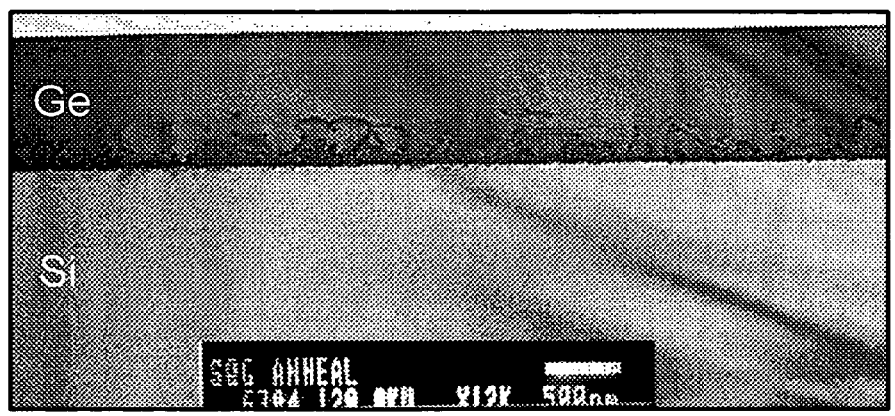
FIG. 3 depicts the wafer of FIG. 2 after cyclic annealing of the germanium film.

FIGS. 2 and 3 show the cross-sectional TEM pictures of the germanium film before and after a cyclic annealing process. FIG. 2 shows a CVD deposited germanium thin film on a silicon wafer, wherein crystal defects are randomly distributed in the germanium film. FIG. 3 shows the same wafer following cyclic annealing of the germanium film, wherein the crystal defects move and accumulate near the bottom of the germanium film, near the germanium/silicon interface. The cycle anneal conditions used to form the wafer of FIG. 3 is 880° C. for 5 minutes, followed by 760° C. for 5 minutes, for 20 cycles.

Figure 4:
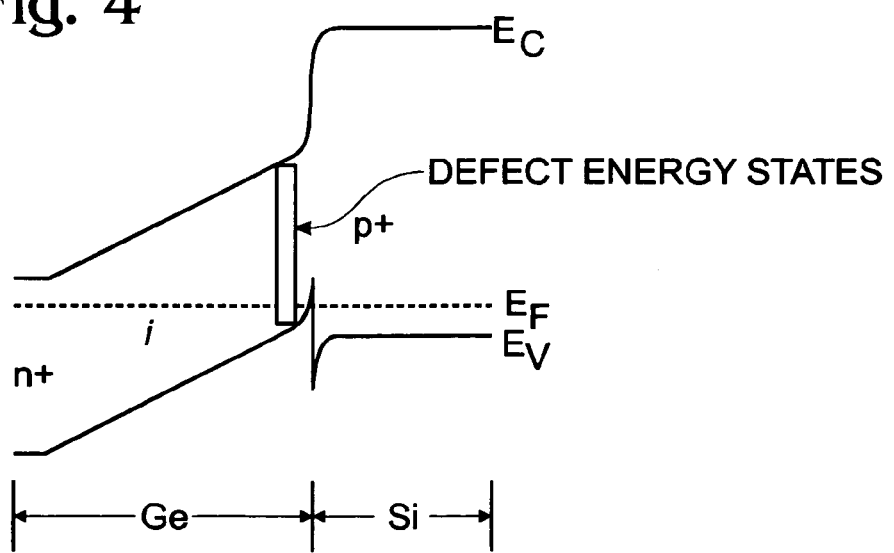
FIG. 4 is a band diagram of an n+ Ge/intrinsic Ge/p+ silicon substrate following the cyclic anneal process of the method of the invention.
Figure 5:
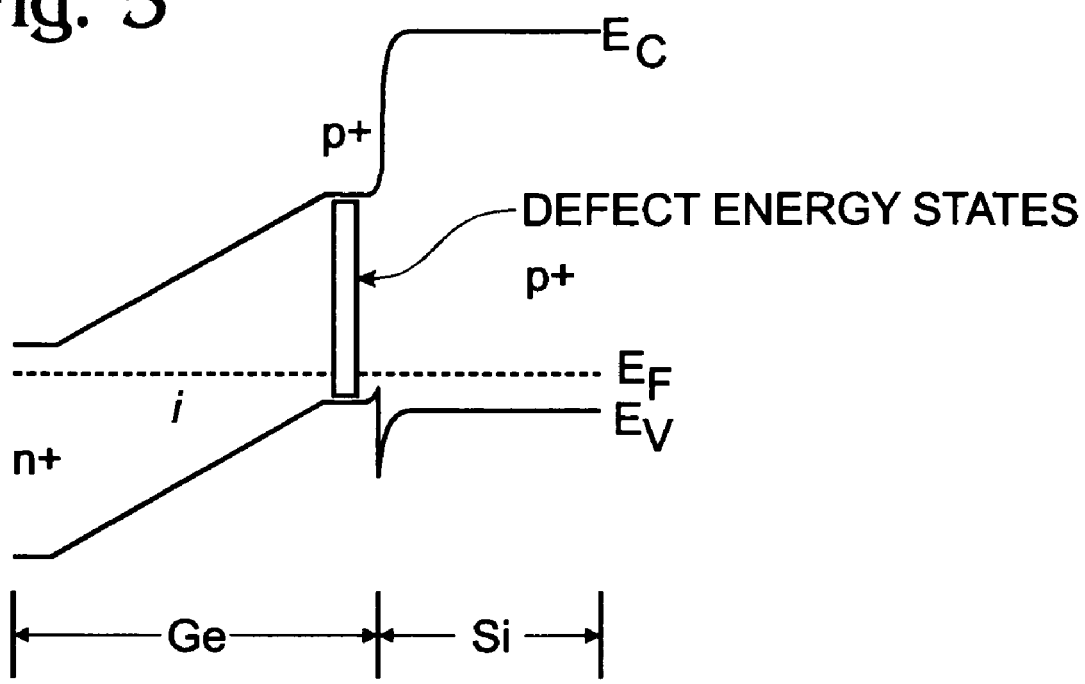
FIG. 5 is a band diagram of an N+Ge/intrinsic Ge/P+ Ge/P+ silicon substrate following cyclic anneal of the method of the invention.

Masini et al., supra, have calculated that the dark current density, based on the band diagram and the defect on the germanium/silicon interface. The band diagram for a PIN germanium diode deposited on P+ silicon substrate is shown in FIGS. 4 and 5, wherein a N+ germanium surface layer is formed by ion implantation and the germanium film has been cyclic annealed. Referring to FIGS. 4 and 5, most of the defects are located near the germanium/silicon interface after cyclic anneal, and these defects have energy states located within the germanium bandgap. As the germanium band gap is 0.66 eV at room temperature, any states located within the germanium bandgap may easily generate electron-hole pairs at room temperature, where the electrons jump to the conduction band and holes jump to the valance band. The electrical field created by the built-in voltage of the P-N diode or the external bias sweep the electrons to the n+ germanium and holes to the P+ silicon and results in dark current.

To prevent erroneous dark-current readings, as a result of the defect generated electron-holes, the bottom germanium layer is heavily doped so that it has a doping similar to that of the silicon surface layer. FIG. 5 depicts an example where p+ germanium is present at the germanium/silicon interface. The defect energy states within the germanium bandgap still generate electron-hole pairs in this region, however, because of the heavy doping of the germanium layer, the electric field does not extend into the P+ germanium region. The electron-hole pairs recombine before they have a chance to diffuse into the intrinsic region, where the electric field is not zero. Because the electrons and holes do not flow to the external circuit, they do not contribute to the dark current.

As shown in the drawings and as described in this Specification, the description includes all steps of the best mode of practicing the invention. There are no additional steps, and the various layers, as described, are formed and/or deposited in sequence without any intervening steps or layers.

Thus, a method of fabricating a low, dark-current germanium-on-silicon PIN photo detector has been disclosed. It will be appreciated that further variations and modifications thereof may be made within the scope of the invention as defined in the appended claims.

We claim:

1. A method of fabricating a low, dark-current germanium-on-silicon PIN photodetector, comprising:
   preparing a P-type silicon wafer;
   implanting the P-type silicon wafer with boron ions;
   activating the boron ions to form a P+ silicon surface region on the silicon wafer;
   forming a boron-doped germanium layer on the P+ silicon surface, including in-situ deposition of a doped p-type germanium layer, wherein the dopant is boron at a concentration is between about $5 \cdot 10^{17}$ cm$^{+3}$ to $2 \cdot 10^{20}$ cm$^{-3}$, and wherein the thickness of the layer is between about 50 nm to 500 nm;
   depositing an intrinsic germanium surface layer on the boron-doped germanium layer;
   cyclic annealing, including heating in a first anneal step at a temperature of about 880° C. for about five minutes, followed by heating in a second anneal step at a temperature of about 760° C. for about five minutes, and repeating the first and second anneal steps for about twenty cycles, thereby forcing crystal defects to the boron-doped germanium layer;
   implanting ions in the germanium surface layer to form an N+ germanium surface layer and a PIN diode; and
   activating the N+ germanium layer by thermal anneal.

2. The method of claim 1 wherein said depositing an intrinsic-germanium surface layer on the boron-doped germanium layer includes depositing an intrinsic germanium layer having a thickness of between about 300 nm to 4000 nm.

3. The method of claim 1 wherein said implanting ions in the germanium surface layer to form an N+ germanium layer and a PIN diode includes implanting ions taken from the group of ions consisting of phosphorus ions and arsenic ions, and which further includes implanting at a dose of between about $5 \cdot 10^{14}$ cm$^{-2}$ to $1 \cdot 10^{16}$ cm$^{-2}$, and at an energy of between about 5 keV to 100 keV.

4. The method of claim 1 wherein said activating the N+ germanium layer by thermal anneal includes thermal anneal at a temperature of between about 500° C. to 800° C., and an annealing time of between about 1 second to 10 hours.

5. A method of fabricating a low, dark-current germanium-on-silicon PIN photodetector, comprising:
   preparing a P-type silicon wafer;
   implanting the P-type silicon wafer with boron ions;
   activating the boron ions to form a P+ silicon surface on the silicon wafer;
   forming a boron-doped germanium layer on the P+ region, which includes forming a germanium layer by a method taken from the group of methods consisting of in-situ deposition of a doped p-type germanium layer, wherein the dopant is boron at a concentration is between about $5 \cdot 10^{17}$ cm$^{-3}$ to $2 \cdot 10^{20}$ cm$^{-3}$, and wherein the thickness of the layer is between about 50 nm to 500 nm and growth of an intrinsic germanium layer, which is implanted with boron ions at an energy of between about 5 keV to 100 keV, and an ion dose of between about $1 \cdot 10^{14}$ cm$^{-2}$ to $1 \cdot 10^{16}$ cm$^{-2}$;
   depositing an intrinsic germanium surface layer on the boron-doped germanium layer;
   cyclic annealing, including heating in a first anneal step at a temperature of about 880° C. for about five minutes, followed by heating in a second anneal step at a temperature of about 760° C. for about five minutes, and repeating the first and second anneal steps for about twenty cycles, thereby forcing crystal defects to the boron-doped germanium layer;
   implanting ions in the germanium surface layer to form an N+ germanium surface layer and a PIN diode; and
   activating the N+ germanium layer by thermal anneal.

6. The method of claim 5 wherein said depositing an intrinsic germanium surface layer on the boron-doped germanium layer includes depositing an intrinsic germanium layer having a thickness of between about 300 run to 4000 nm.

7. The method of claim 5 wherein said implanting ions in the germanium surface layer to form an N+ germanium layer and a PIN diode includes implanting ions taken from the group of ions consisting of phosphorus ions and arsenic ions, and which further includes implanting at a dose of between about $5 \cdot 10^{14}$ cm$^{-2}$ to $1 \cdot 10^{16}$ cm$^{-2}$, and at an energy of between about 5 keV to 100 keV.

8. The method of claim 5 wherein said activating the N+ germanium layer by thermal anneal includes thermal anneal at a temperature of between about 500° C. to 800° C., and an annealing time of between about 1 second to 10 hours.

9. A method of fabricating a low, dark-current germanium-on-silicon PIN photodetector, comprising:
preparing a P-type silicon wafer;
implanting the P-type silicon wafer with boron ions;
activating the boron ions to form a P+ surface region on the silicon wafer;
forming a boron-doped germanium layer on the P+ surface region, includes in-situ deposition of a doped p-type germanium layer, wherein the dopant is boron at a concentration is between about $5 \cdot 10^{17}$ cm$^{-3}$ to $2 \cdot 10^{20}$ cm$^{-3}$, and wherein the thickness of the layer is between about 50 nm to 500 nm;
depositing an intrinsic germanium surface layer on the boron-doped germanium layer;
cyclic annealing, to force crystal defects to the boron-doped germanium layer;
implanting ions in the germanium surface layer to form an N+ germanium layer and a PIN diode; and
activating the N+ germanium surface layer by thermal anneal.

10. The method of claim 9 wherein said depositing an intrinsic germanium surface layer on the boron-doped germanium layer includes depositing an intrinsic germanium layer having a thickness of between about 300 nm to 4000 nm.

11. The method of claim 9 wherein said implanting ions in the germanium surface layer to form an N+ germanium layer and a PIN diode includes implanting ions taken from the group of ions consisting of phosphorus ions and arsenic ions, and which further includes implanting at a dose of between about $5 \cdot 10^{14}$ cm$^{-2}$ to $1 \cdot 10^{16}$ cm$^{-2}$, and at an energy of between about 5 keV to 100 keV.

12. The method of claim 9 wherein said activating the N+ germanium layer by thermal anneal includes thermal anneal at a temperature of between about 500° C. to 800° C., and an annealing time of between about 1 second to 10 hours.

13. The method of claim 9 wherein said cyclic anneal includes heating in a first anneal step at; a temperature of about 880° C. for about five minutes, followed by heating in a second anneal step at a temperature of about 760° C. for about five minutes, and repeating the first and second anneal steps for about twenty cycles.

* * * * *